United States Patent
Hofmann et al.

(10) Patent No.: US 10,401,737 B2
(45) Date of Patent: Sep. 3, 2019

(54) PROCESS DOSE AND PROCESS BIAS DETERMINATION FOR BEAM LITHOGRAPHY

(71) Applicant: GenISys GmbH, Taufkirchen (DE)

(72) Inventors: Ulrich Hofmann, Munich (DE); Nezih Uenal, Taufkirchen (DE)

(73) Assignee: GenISys GmbH, Taufkirchen (DE)

(*) Notice: Subject to any disclaimer, the term of this patent is extended or adjusted under 35 U.S.C. 154(b) by 0 days.

(21) Appl. No.: 15/785,785

(22) Filed: Oct. 17, 2017

(65) Prior Publication Data

US 2018/0173108 A1 Jun. 21, 2018

(30) Foreign Application Priority Data

Dec. 20, 2016 (EP) .................................... 16002708

(51) Int. Cl.
*G03F 7/20* (2006.01)
*G03F 1/44* (2012.01)
(Continued)

(52) U.S. Cl.
CPC ............ *G03F 7/70558* (2013.01); *G03F 1/44* (2013.01); *G03F 1/78* (2013.01); *G03F 7/705* (2013.01);
(Continued)

(58) Field of Classification Search
CPC .. G03F 7/705; G03F 7/70558; G03F 7/70625; H01J 37/3174; H01J 2237/3175
See application file for complete search history.

(56) References Cited

U.S. PATENT DOCUMENTS

2002/0056073 A1* 5/2002 Satoh .................. G06F 17/5077
716/54
2002/0145719 A1* 10/2002 Govil .................. G03F 7/70066
355/69
(Continued)

FOREIGN PATENT DOCUMENTS

JP 2012-212792 A 11/2012
JP 2013-135201 A 7/2013
(Continued)

OTHER PUBLICATIONS

Erdmann et al., "Predictive Modeling of EUV-Lithography: The Role of Mask, Optics, and Photoresist Effects", Physical Optics, 2011, vol. 8171, cited in Extended European Search Report (16 pages).
(Continued)

*Primary Examiner* — Vuthe Siek
*Assistant Examiner* — Aric Lin
(74) *Attorney, Agent, or Firm* — Westerman, Hattori, Daniels & Adrian, LLP

(57) ABSTRACT

A technique and method for determining a process dose for a beam lithography process includes accessing a data set that enables associating (i) a plurality of measured dimensions of features exposed by beam lithography with (ii) a plurality of different exposure doses, wherein the features were exposed with the different exposure doses, and with (iii) at least one of a plurality of different densities of the exposed features and a plurality of different nominal dimensions of the exposed features. The method also includes providing a model that is parameterized in at least the following parameters (i) measured feature dimension; (ii) exposure dose; (iii) at least one of feature density and nominal feature dimension; (iv) process dose; and (v) at least one process bias. In
(Continued)

a further step, the method includes fitting the model with the data set to determine the process dose and the process bias.

15 Claims, 9 Drawing Sheets

(51) Int. Cl.
*G03F 1/78* (2012.01)
*H01J 37/317* (2006.01)

(52) U.S. Cl.
CPC ...... *G03F 7/70441* (2013.01); *G03F 7/70616* (2013.01); *G03F 7/70625* (2013.01); *H01J 37/3174* (2013.01)

(56) References Cited

U.S. PATENT DOCUMENTS

| | | | |
|---|---|---|---|
| 2005/0026047 A1* | 2/2005 | Yang | G03F 1/36 430/5 |
| 2006/0057471 A1 | 3/2006 | Schenau et al. | |
| 2006/0206851 A1 | 9/2006 | Van Wingerden et al. | |
| 2007/0146670 A1 | 6/2007 | Kruijswijk | |
| 2008/0067446 A1 | 3/2008 | Belic et al. | |
| 2010/0119961 A1* | 5/2010 | Ye | G03F 1/144 430/30 |
| 2012/0328983 A1* | 12/2012 | Kramer | C08F 220/28 430/270.1 |

FOREIGN PATENT DOCUMENTS

| | | |
|---|---|---|
| JP | 2013-183048 A | 9/2013 |
| JP | 2014-75425 A | 4/2014 |
| JP | 2014-187201 A | 10/2014 |
| JP | 2014-187212 A | 10/2014 |
| JP | 2014-229662 A | 12/2014 |
| JP | 2014-229802 A | 12/2014 |
| JP | 2015-162513 A | 9/2015 |

OTHER PUBLICATIONS

Keil et al., "Determination of best focus and optimum dose for variable shaped e-beam systems by applying the isofocal dose method", Mircroelectronic Engineering, 2008, vol. 85, pp. 778-781, cited in Extended European Search Report (4 pages).
Sauer et al., "Electron-beam lithography simulation for maskmaking, part IV: Effect of resist contrast on isofocal dose", SPIE, vol. 3748, pp. 27-40 (15 pages).
Extended European Search Report dated Jul. 24, 2017, issued in counterpart European Patent Application No. 16002708.2 (5 pages).
Office Action dated Aug. 28, 2018, issued in counterpart Japanese Application No. 2017-224229, with English translation of the Examiner's reasoning. (10 pages).

* cited by examiner

| Feature density | Measured CD [μm] | Base Dose [μC/cm2] |
|---|---|---|
| ... | | |
| 25% | 0.295 | 72 |
| 25% | 0.345 | 120 |
| ... | | |
| 50% | 0.315 | 100 |
| 50% | 0.325 | 120 |
| ... | | |

Data Set 440

Fig. 7

PROCESS DOSE AND PROCESS BIAS DETERMINATION FOR BEAM LITHOGRAPHY

TECHNICAL FIELD

The present disclosure generally relates to beam lithography. In particular, a technique for determining a process dose and a process bias for a beam lithography process is presented. The technique can be implemented in the form of a method, a computer program product and an apparatus.

BACKGROUND

Masks for optical lithography and other patterns having features in the nanometer regime are typically fabricated using beam lithography processes, such as electron beam writing or laser beam writing. In a beam lithography process, a radiation sensitive resist on a substrate is exposed by beam writing. The resist is then developed to remove the exposed (in the case of a positive tone resist) or unexposed (in the case of a negative tone resist) resist portions. The resist portions that remain are used as a basis for a pattern transfer on the substrate. This pattern transfer includes, in a mask fabrication example, etching a masking layer on a transparent mask blank in the removed resist areas.

The energy deposited by beam writing in the resist (i.e., the exposure dose) has an influence on the development process. This means—in the exemplary case of a positive tone resist—that below a predefined energy threshold (that is required to fully expose the resist), the resist cannot be removed by development. When the same feature such as an isolated line having a certain nominal line width (as written by a beam writing apparatus) is exposed with different exposure doses at or above the energy threshold, the actual line width after resist development (and, optionally, after a pattern transfer process) increases with the exposure dose as shown in FIG. 1 for an isolated line and assuming a nominal line width of 0.30 μm.

In FIG. 1, the x axis is indicative of the exposure dose and the y axis is indicative of the actual Critical Dimension, or CD. The actual CD is the measured CD after resist exposure, resist development and, optionally, pattern transfer. The pattern transfer is needed in case the measurements are not performed on the developed resist pattern but on a pattern transferred (e.g., etched) through the patterned resist into a layer below the resist layer. In the present exemplary case of a line, the CD corresponds to the line width.

There are various reasons for the dependency of the CD on the exposure dose. These reasons include the beam profile, artefacts introduced by the beam writing apparatus (e.g., beam blur and focus errors), physical effects of beam writing (e.g., electron scattering and fogging) and process artefacts (e.g., resist blur, process loading effects of one or both of development and etching, and pattern transfer effects).

Electron scattering artefacts have been widely investigated in electron beam lithography. When a resist has been exposed by electron beam writing, electron scattering prevents that the developed resist regions mirror exactly the exposed resist regions. Electron scattering occurs within the resist itself as well as at the underlying substrate (in terms of backscattering). Moreover, some of the scattered electrons escape the resist towards the beam writing apparatus and are reflected back by an objective lens of the apparatus. This effect is called fogging. Correction of backscattering and fogging as well as proximity effect correction for dense patterns are widely employed today to compensate electron scattering artefacts.

One of the challenges in a beam lithography process is the search for an optimal process point. The process point can be defined, inter alia, in terms of a so-called process dose. The optimum process dose for a given beam lithography process is dependent on the overall process parameters, such as resist sensitivity, resist thickness, development parameters (e.g., chemistry, time and temperature of the development process), etching bias and loading, and so on.

In some cases, the optimum process dose is the so-called base dose that is set at the beam writing apparatus and calibrated using experimental data. By additionally applying a dose factor to the base dose for dose modulation, a proximity effect correction of electron scattering artefacts and similar artefacts that have a dependency on a feature density of the target pattern can separately be applied. The actual exposure dose will in such a scenario be jointly determined by the base dose and the dose factor.

In regard of the dependency of the actual CD, such as a line width after resist development, on the exposure dose, one could for example set the exposure dose to the so-called dose-to-size. So when an actual CD of 0.30 μm is desired, the dose-to-size in the scenario of FIG. 1 is 120 pC/cm².

However, an actual CD of 0.30 μm could also be obtained by using a higher (or lower) exposure dose if the nominal CD as written by the beam writing apparatus was shrank (or expanded). As exemplarily illustrated in FIG. 2, an exposure dose of 140 μC/cm² (i.e., an exposure dose higher than the dose-to-size of 120 μC/cm²) results in CD of approximately 0.31 μm. For this reason, also an exposure dose of 140 μC/cm² could be used to arrive at an actual CD of 0.30 μm if the nominal CD was in turn shrank to approximately 0.29 μm. Therefore, an actual CD of 0.30 μm could either be realized by writing a 0.30 μm line width using an exposure dose of 120 μC/cm² (i.e., the dose-to-size) or by writing a 0.29 μm line width using an exposure dose of 140 μC/cm². Both process points in terms of an exposure dose of 120 μC/cm² and an exposure dose of 140 μC/cm² are equally valid for realizing an actual CD of 0.30 μm (assuming an appropriate size adaptation of the written pattern for the higher exposure dose).

There may be various considerations that favor one dose over the other to arrive at a target resist pattern (e.g., in terms of a target CD). For example, in many lithography processes the so-called isofocal dose will be the optimum process dose (in terms of the base dose set at the exposure apparatus). Originally, the isofocal process point has mainly been investigated in regard of optical lithography. It has recently been suggested to use the isofocal process point also for beam lithography processes, see Chris Mack, Electron-beam lithography simulation for mask making, part IV, proceedings of Photomask and X-Ray Mask Technology VI, SPIE Vol. 3748, pp. 27-40, and K. Keil et al, Determination of best focus and optimum dose for variable shaped e-beam systems by applying the isofocal dose method, Microelectronic Engineering 85 (2008) 778-781.

The isofocal dose is the process dose for which the actual CD is independent from the beam focus, as schematically illustrated in FIG. 3. The relevance of the isofocal dose derives from the fact that during the beam writing process, the beam is scanned or otherwise moved within the lithography field to write a pattern into the resist. The pattern-defining beam typically is at its best focus at the center of the lithography field and gets increasingly out of focus as it is directed to the borders of the lithography field, resulting in a larger spot size. In addition, resist thickness variations and an uneven substrate likewise contribute to the beam being out of focus. The influence of all these, and other, effects on the beam writing process can significantly be reduced when the exposure dose is set to the isofocal dose.

In practice, however, most beam writing apparatuses do not permit an intentional adjustment of the beam focus during the exposure process, or from one exposure process to the next. As such, the isofocal dose cannot easily be determined by experiments because the beam focus cannot actively be varied in an effort to derive the isofocal dose.

A further challenge in the experimental determination of the isofocal dose is the fact that the experimental data for dose calibration are correlated with many other process-dependent parameters that give rise to the so-called process bias. As this process bias-dependency cannot be easily decoupled in the experimental data from the base dose-dependency, there is presently no feasible way to properly calibrate the isofocal dose (or any other optimum process dose).

Prior art is known from US 2008/067446 A1 as well as US 2006/206851 A1.

SUMMARY

There is a need for a technique that permits an efficient determination of a process dose and a process bias for a given beam lithography process.

According to one aspect, a method of determining a process dose and a process bias for a beam lithography process is provided. The method comprises accessing a data set that enables to associate (i) a plurality of measured dimensions of features exposed by beam lithography with (ii) a plurality of different exposure doses, wherein the features were exposed with the different exposure doses, and with (iii) at least one of a plurality of different feature densities of the exposed features and a plurality of different nominal dimensions of the exposed features. The method further comprises providing a model that is parameterized in at least the following parameters (i) measured feature dimension; (ii) exposure dose; (iii) at least one of feature density and nominal feature dimension; (iv) process dose; and (v) at least one process bias. The method also comprises fitting the model with the data set to determine the process dose and the process bias.

As such, the process dose parameter may be modelled separately from the at least one process bias parameter in the model. Such a decoupling, in combination with the selection of suitable experimental data, enables an isolation of process dose effects from process bias effects and, thus, a separate determination of the process dose and the process bias for a given beam lithography process. At the same time, one or more further process parameters optionally included in the model may be determined as a by-product, such as process blur (e.g., in terms of one or more of a resist blur, a beam blur, etc.).

Once the process dose has been determined from the model and the data set, the process dose may be set as the base dose at a beam writing apparatus for the later fabrication of optical lithography masks or other patterns having features in the nanometer regime. Moreover, the process bias as also determined from the model and the data set may form the basis for calculating a factor for shrinking or expanding (as explained above with reference to FIG. 2) a pattern layout to be written by the beam writing apparatus in the actual pattern fabrication.

One or more assumptions and/or parameter settings for modeling a particular "optimum" process dose (e.g., the isofocal dose or a dose for three-dimensional resist patterning) may be included in the model. As such, the particular process dose resulting from the fitting process will be characterized by such assumptions and/or parameter settings in the model.

The model may comprise one or more terms, and each term may include one or more of the above parameters (i) to (v). In case of two or more terms, each term may either be an additive or multiplicative term.

In one variant, the model comprises a process dose term including the process dose parameter. The process dose term may be modelled under the assumption that a ratio between the process dose and one of a threshold dose to clear an exposed resist and an onset dose to have an exposed resists remain is a constant. As an example, the constant may equal 0.5 to set the process dose to the isofocal dose. Alternatively, the constant may equal 1.0 to set the process dose for three-dimensional lithography.

The process dose term may additionally include the feature density parameter. In the fitting process, the feature dimension parameter in the model may be populated with the one or more feature densities as derivable from the data set. Alternatively, or in addition, the process dose term may further include a nominal feature dimension parameter. In the fitting process, the nominal feature dimension parameter in the model may be populated with the one or more nominal feature dimensions (e.g., in terms of different CDs) as derivable from the data set.

In one example, the process dose term is modelled to include the ratio ProcessDose/(constant*$D_{exp}$), wherein ProcessDose is the process dose parameter (to be determined) and $D_{exp}$ is the exposure dose parameter. The process dose term may be, modelled as an additive term in the model.

In the fitting process, the exposure dose parameter $D_{exp}$ in the model may be populated with the different exposure doses as derivable from the data set. The exposure doses may be directly included in the data set or may be calculated from other information included the data set or obtained otherwise. For example, when the data set includes bases doses $D_{BaseDose}$ (as, for example, set by an operator at the beam writing apparatus) and data that permit to determine associated dose factors $D_f$ as used in the beam writing process, the exposure doses may be determined by multiplying the base doses $D_{BaseDose}$ with the associated dose factors $D_f$. Data that permit to determine the dose factors $D_f$ include, for example, associated feature densities and one or more of beam form information, fogging information and electron scattering information (e.g., in terms of a Point Spread Function, PSF, modeling one or more of the beam form, fogging and electron scattering).

The dose factor $D_f$ thus exhibits a dependency on the respective feature density. It should be noted that the dose factor $D_f$ could equal 1 or could be larger or smaller than 1. Moreover, the dose factor $D_f$ could be constant for the data set (e.g., in case the data set is indicative of different critical dimensions).

The model may comprise a process bias term including the at least one process bias parameter. The process bias term may be feature density-independent. Additionally, or as an alternative, the process bias term may be modelled as an additive term in the model. Specifically, the process bias term may in some variants be modelled as an additive constant in the model.

The process bias term may include two or more process bias parameters. For example, the process bias term may include a first process bias parameter that is assumed to be constant and a second process bias parameter that is assumed to reflect a feature density-dependency (e.g., in a lateral direction). In the fitting process, both process bias parameters may individually be determined. The first process bias parameter may be included in a first process bias sub-term and the second process bias parameter may be included in a second process bias sub-term. The process bias term may include a sum of the first and second process bias sub-terms.

The model may comprise a measured feature dimension term including the measured feature dimension parameter. The measured feature dimension term may be modelled as an additive term in the model (e.g., as an additive constant). In the fitting process, the feature dimension parameter in the model may be populated with the different feature dimensions as derivable from the data set.

The model may further be parameterized in a blur parameter corresponding to a process blur (e.g., a resist blur and/or a beam blur and/or other blur types). As such, the model may comprise a blur term including the blur parameter. The blur term may be modelled as an additive term in the model (e.g., as an additive constant). In some variants, the model may include a product of a process dose term comprising the process dose parameter and a blur term comprising the blur parameter.

When the model is additionally parameterized in the blur parameter, also the process blur may be determined in the fitting step (in addition to the process dose and the process bias). Based on the process blur resulting from the fitting, a given PSF (or similar information) and a given feature density, the dose factor $D_f$ can be determined for proximity effect correction during the actual fabrication process of optical lithography masks or other patterns with features in the nanometer regime.

For target patterns with locally varying feature densities, the dose factor $D_f$ to be applied by the beam writing tool in the fabrication process will vary accordingly. The locally varying dose factor $D_f$ may be incorporated in a data set generated for a target layout for the fabrication process (as input into the beam writing apparatus). Alternatively, the locally varying dose factor $D_f$ may be calculated by the beam writing apparatus "on the fly" when writing a pattern based on the target layout.

The data set used in the fitting step may be indicative of measured feature dimensions of multiple features (e.g., individual lines in line patterns of different densities). The multiple features may have been exposed to have at least one common nominal dimension. If, for example, the features take the form of lines, the lines may have been exposed to have a common nominal line width. The line width may be less than 1 μm.

In case of a common nominal dimension of the features, the received data set may be indicative of different feature densities. In an alternative scenario, the features may have been exposed to have different nominal dimensions (e.g., in terms of different line widths) but the same feature densities. In a still further variant, the features may have been exposed to have different feature densities as well as different nominal dimensions.

The data set may have been generated based on one or more patterns of the features to be exposed being subjected to a proximity effect correction prior to exposure. The proximity effect correction may have been effected using the feature density-dependent dose factor.

The process dose term determined by fitting the model with the data set may be set at a beam writing apparatus that is configured to expose a lithography pattern (i.e., for mask fabrication purposes). Assuming that the data set has been obtained on the basis of a set of process parameters, the same process parameters may be used in the actual fabrication process for the lithography pattern. As such, the lithography pattern may be processed utilizing a first set of process parameters and that first set of process parameters may at least be similar (or identical) to a second set of process parameters of experiments based on which the fitted data set has been obtained.

Also provided is a computer program product comprising program code portions for performing the steps of any of the methods and method aspects presented herein when the computer program product is run on a computer system. The computer program product may be stored on a computer-readable recording medium such as a semi-conductor memory, hard drive, CD-ROM or DVD-ROM. Also, the computer program product may be provided for download via a network, such as the Internet.

According to a further aspect, an apparatus for determining a process dose and a process bias for a beam lithography process is provided. The apparatus is adapted to access a data set that enables to associate (i) a plurality of measured dimensions of features exposed by beam lithography with (ii) a plurality of different exposure doses, wherein the features were exposed with the different exposure doses, and with (iii) at least one of a plurality of different feature densities of the exposed features and a plurality of different nominal dimensions of the exposed features. The apparatus is further adapted to store a model that is parameterized in at least the following parameters: (i) measured feature dimension; (ii) exposure dose; (iii) at least one of feature density and nominal feature dimension; (iv) process dose; and (v) at least one process bias. The apparatus is additionally adapted to fit the model with the data set to determine the process dose and the process bias.

The determining apparatus may be configured as a computer system. The computer system may further comprise a computer-readable recording medium with a computer program product causing the processor system to execute the steps of one or more of the methods and method aspects presented herein.

Also provided is a lithography system comprising a beam writing apparatus configured to set the process dose determined by the determining apparatus. The system may further comprise the determining apparatus as such. The apparatus may be coupled to the beam writing apparatus via a wired or wireless communication link, or to may be an integral part of the beam writing apparatus.

BRIEF DESCRIPTION OF THE DRAWINGS

Further aspects, details and advantages of the present disclosure will become apparent from the following description of exemplary embodiments and the drawings, wherein:

FIG. 7 is a schematic diagram illustrating a data set obtained on the basis of the resist patterns of FIG. 6.

DETAILED DESCRIPTION

In the following description of exemplary embodiments, for purposes of explanation and not limitation, specific details are set forth, such as particular test patterns, in order to provide a thorough understanding of the technique presented herein. It will be apparent to one skilled in the art that the technique presented herein may be practiced in other embodiments that depart from these specific details. Moreover, while the following embodiments will primarily be described with respect to electron beam writing, it will be appreciated that the technique presented herein could also be implemented in connection with laser beam writing.

Those skilled in the art will further appreciate that many of the methods, functions and procedures presented herein can be implemented using software in conjunction with a programmed microprocessor, digital signal processor or general purpose computer. For example, the present disclosure may be embodied in a computer program product which can be loaded on a computer system that comprises one or more processors and one or more memories, wherein the one or more memories are configured to store one or more programs that perform certain methods, functions and procedures disclosed herein when run on the one or more processors of the computer system.

The exemplary embodiments described below provide a technique for determining an optimal process dose for a beam lithography process. The embodiments will be described with reference to the isofocal dose as an example for an optimal process dose. In other cases, for example for lithographically structuring three-dimensional resist patterns, other process doses may be optimum.

The optimum process dose for a particular beam lithography process is correlated with other process parameters. These other process parameters give rise to a process bias. For decoupling a process bias-dependency from a process dose-dependency of a beam lithography process, suitable experimental data for that beam lithography process and a suitably parameterized model reflecting the underlying correlation and the optimum process dose need to be obtained. By fitting the model with the experimental data, the modelled process dose and the modelled process bias can be separately determined. The resulting process dose can then be used (e.g., as the base dose) for fabricating structures in the nanometer regime. The resulting process bias can likewise be used in the fabricating process (e.g., for a size adaptation of a target pattern to be written by the beam writing apparatus). In some variants, the fitting of the model with the experimental data permits to additionally determine the process blur as a parameter for proximity effect correction in the fabricating process. These aspects will now be described in greater detail with reference to the embodiments of FIGS. 4 to 8.

Figure 4A:
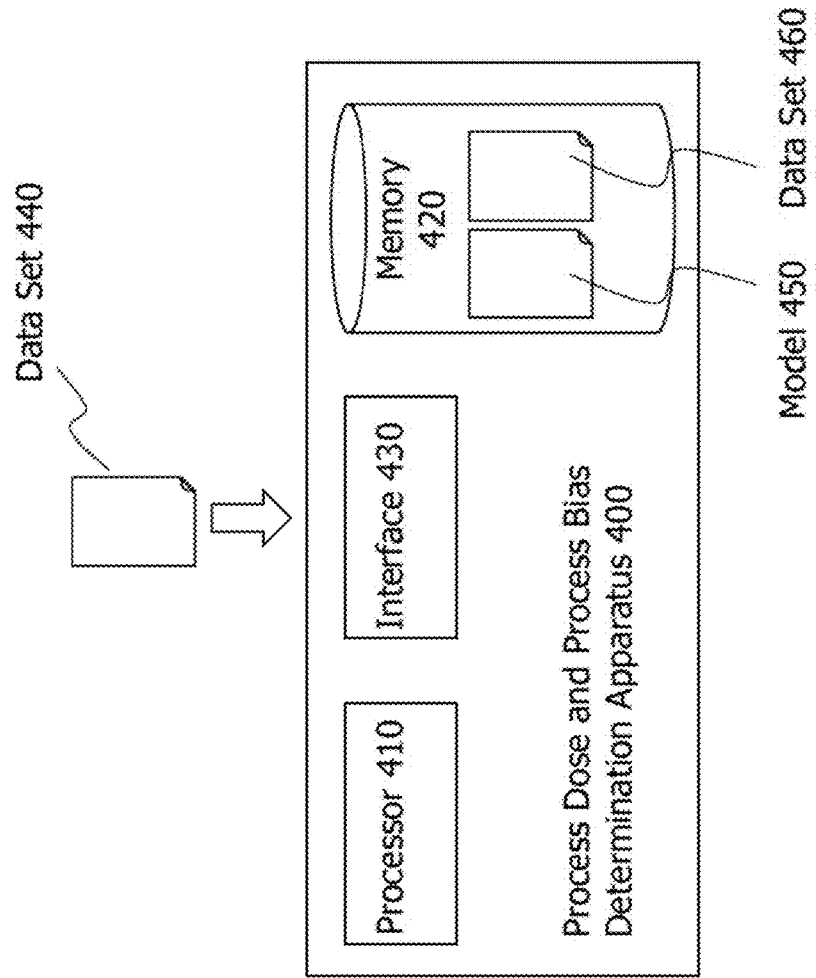
FIG. 4A is a diagram illustrating an embodiment f an apparatus for process dose determination.

FIG. 4A illustrates an embodiment of a process dose and process bias determination apparatus 400. As illustrated in FIG. 4A, the apparatus 400 comprises a processor 410, a memory 420 and an interface 430.

The processor 410 is configured to access the memory 420 and to process program code portions and information stored therein. The interface 430 is configured to receive one or more data sets 440 pertaining to experimental data as will be described in more detail below. The one or more data sets 440 received via the interface 430 may be stored in the memory 420. In certain variants, the one or more data sets 440 can be enriched with further information and stored as one or more enriched data sets 460 in the memory 420.

Also stored in the memory 420 is a model 450 that is to be fitted with the data sets 440 for the purpose of determining the process dose and, associated therewith, the process bias. Specifically, the model 450 is parameterized in the following, and optional further, parameters (i) measured feature dimension; (ii) exposure dose; (iii) at least one of feature density and nominal feature dimension; (iv) process dose; (v) at least one process bias; and, optionally, (vi) process blur. In the fitting process, the parameters (i) to (iii) will be taken as input from the data set, whereas the parameters (iv), (v) and, optionally, (vi) will be determined as output.

In some variants, the model 450 comprises a process dose term including the process dose parameter. The process dose term is modelled under the assumption that a ratio between the process dose and one of a threshold dose to clear an exposed resist (positive tone resist) and an on-set dose to have an exposed resist remain (negative tone resist) is a constant. The constant will equal 0.5 when the (optimum) process dose to be set to the isofocal dose. In other embodiments, the constant may equal 1 (to set a process dose for three-dimensional lithography) or any other value. Specifically, for an isofocal scenario the process dose term may be modelled to include the ratio $ProcessDose/(0.5*D_{exp})$, wherein ProcessDose is the process dose parameter to be determined by the model and $D_{exp}$ is the exposure dose parameter to be populated with the exposure doses from the data set. The exposure doses may be determined in experiments from the base doses $D_{BaseDose}$ as typically set at the beam writing apparatus, optionally multiplied by an associated dose factor $D_f$ as follows: $D_{exp}=D_f*D_{BaseDose}$.

In addition to the process dose term, the model 450 comprises a process bias term including at least one process bias parameter and/or a measured feature dimension term including the measured feature dimension parameter. Moreover, a lateral development bias may be considered in a further additive term.

Figure 4B:
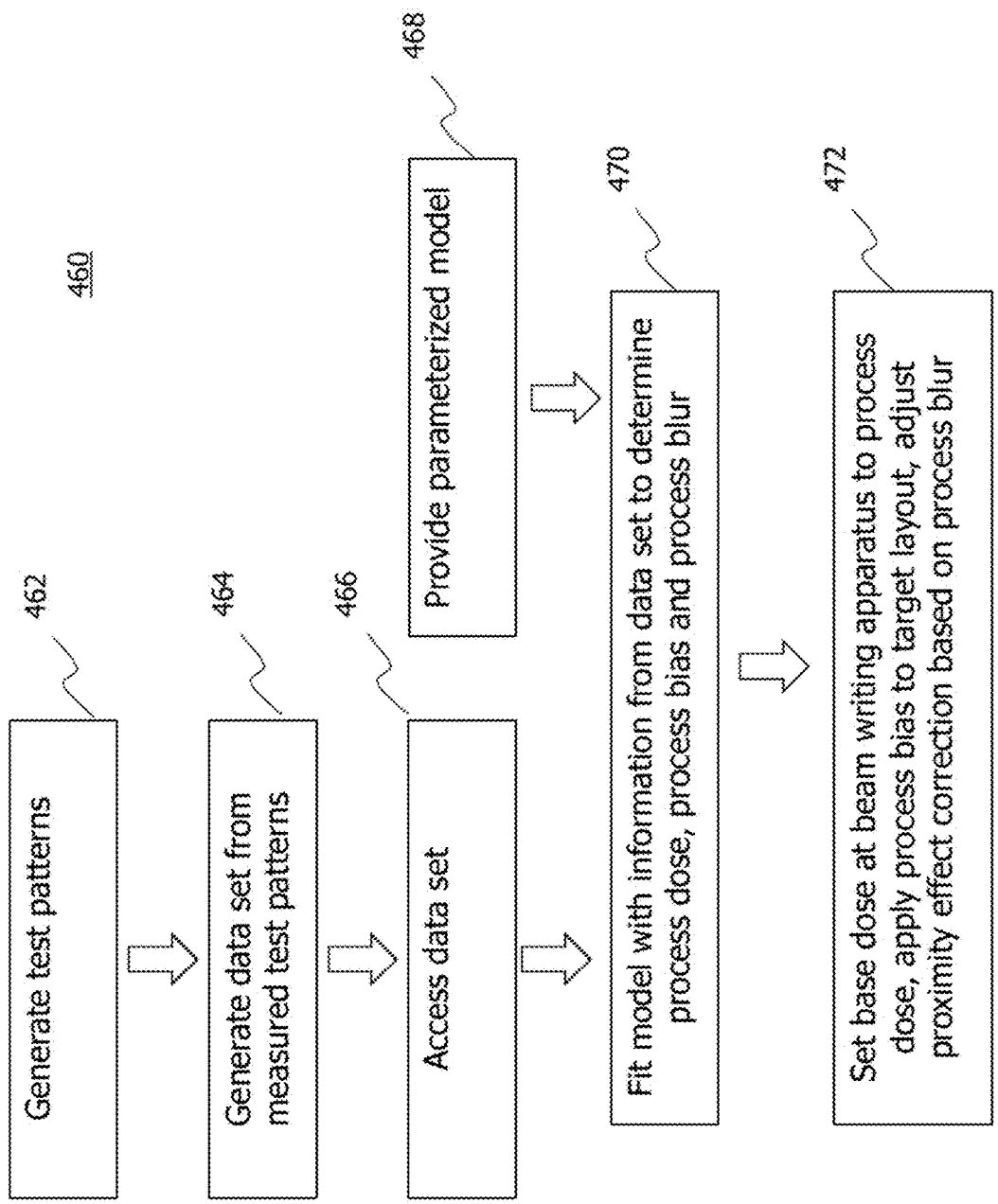
FIG. 4B is a flow diagram illustrating a method embodiment of the present disclosure.

FIG. 4B illustrates a flow diagram of a method embodiment for determining and setting an optimum process dose and further process parameters.

The method embodiment as illustrated in FIG. 4B starts with generating test patterns for a given beam lithography process in step 462. The test patterns are generated in step 462 using the same beam lithography process that will later on be used for the actual fabrication of optical lithography masks or other patterns in the nanometer regime. The beam lithography process is defined by a set of process parameters, such as the base dose and dose factor as set at a beam writing apparatus, resist-related parameters (such as resist sensitivity, resist thickness, and so on), development parameters (e.g., chemistry, time and temperature of the development process), and so on.

Figure 5:
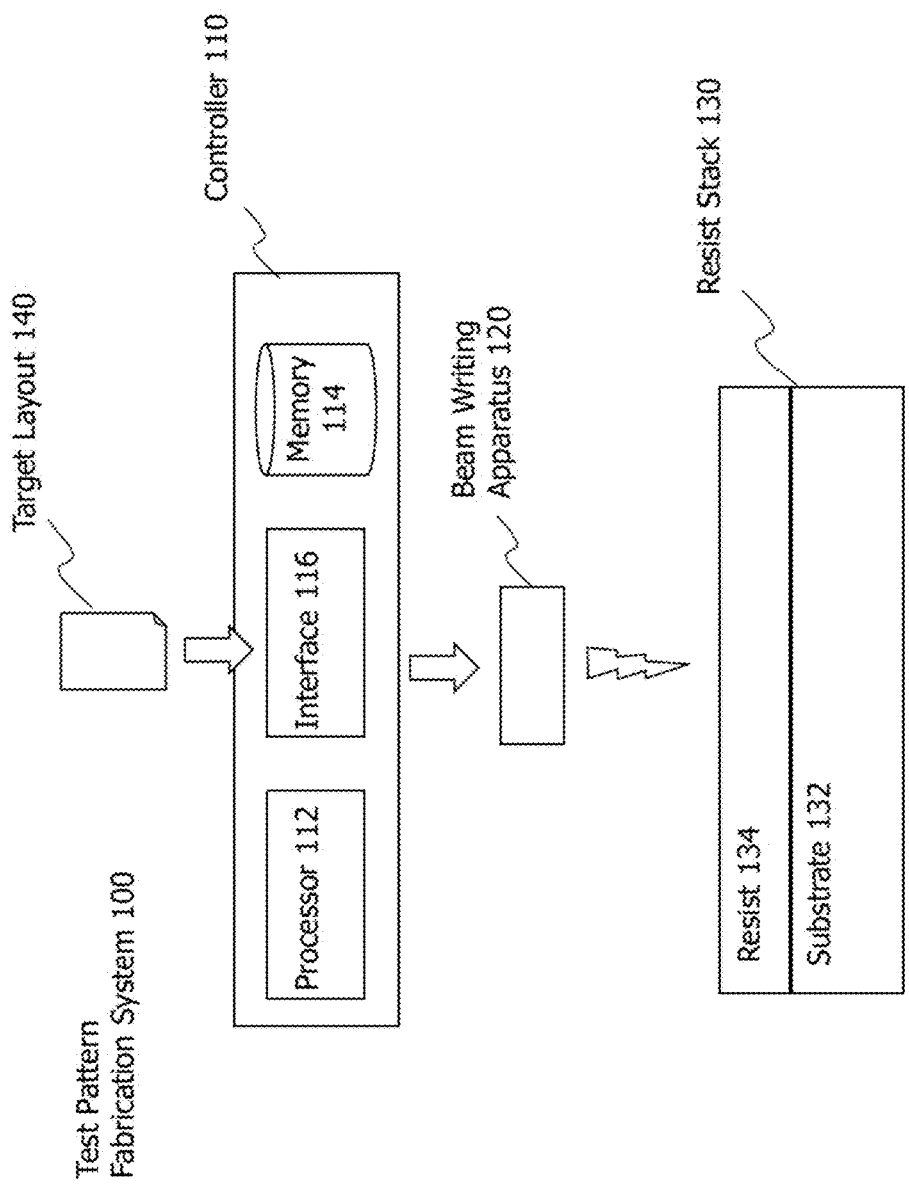
FIG. 5 schematically illustrates an, embodiment of a test pattern fabrication system with a beam writing apparatus.

FIG. 5 schematically illustrates an embodiment of a test pattern fabrication system 100 as used in step 462. As shown in FIG. 5, the system 100 comprises a controller 110 with at least one processor 112 (e.g., in the form of a Central Processing Unit, CPU) and a memory 114 (e.g., in the form of a hard disk or semi-conductor memory) that stores program code to be run on the processor 112. Additionally, the controller 110 comprises an interface for receiving data sets or other information to be processed by the processor 112 and, optionally, to be stored in the memory 114.

The system 100 further comprises a beam writing apparatus 120, such as an electron beam writer or a laser beam writer. In certain configurations, the controller 110 may be integrated in the beam writing apparatus 120. In other configurations, the controller 110 may be a stand-alone computer or other device.

FIG. 5 shows a resist stack 130 to be patterned by beam writing. The resist stack 130 comprises a substrate 132 coated with a resist 134. The substrate 132 may comprise or consist of fused silica. Depending on the configuration of the beam writing apparatus 120, the resist 134 is sensitive to electron radiation or laser radiation. The resist 134 can be a positive tone resist or a negative tone resist. Different technologies known in the art may be used for coating the mask substrate 132 with the resist 134.

Figure 6:
FIG. 6 schematically illustrates resist patterns fabricated by the system of FIG. 5.

The controller 110 is configured to control the beam writing apparatus 120 in accordance with a target layout 140 stored in the memory 114 or being accessible via the interface 116. The target layout 140 is a data set that defines one or multiple target patterns to be written by the beam writing apparatus 120 into the resist 134. In the present case, the target layout defines five different line patterns as schematically illustrated in FIG. 6. The line patterns have different line densities, including an isolated line (density 0%) and line patterns with 25%, 50%, 75% and 100% line densities. A line pattern with 50% line density means that the linear spaces between the lines have the same widths as the lines. A line pattern with 100% line density means that an isolated line is surrounded by a contiguous area without any spaces, with the isolated line being only neighbored by minimum linear spaces so as to allow a measurement of its line width.

Figure 1:
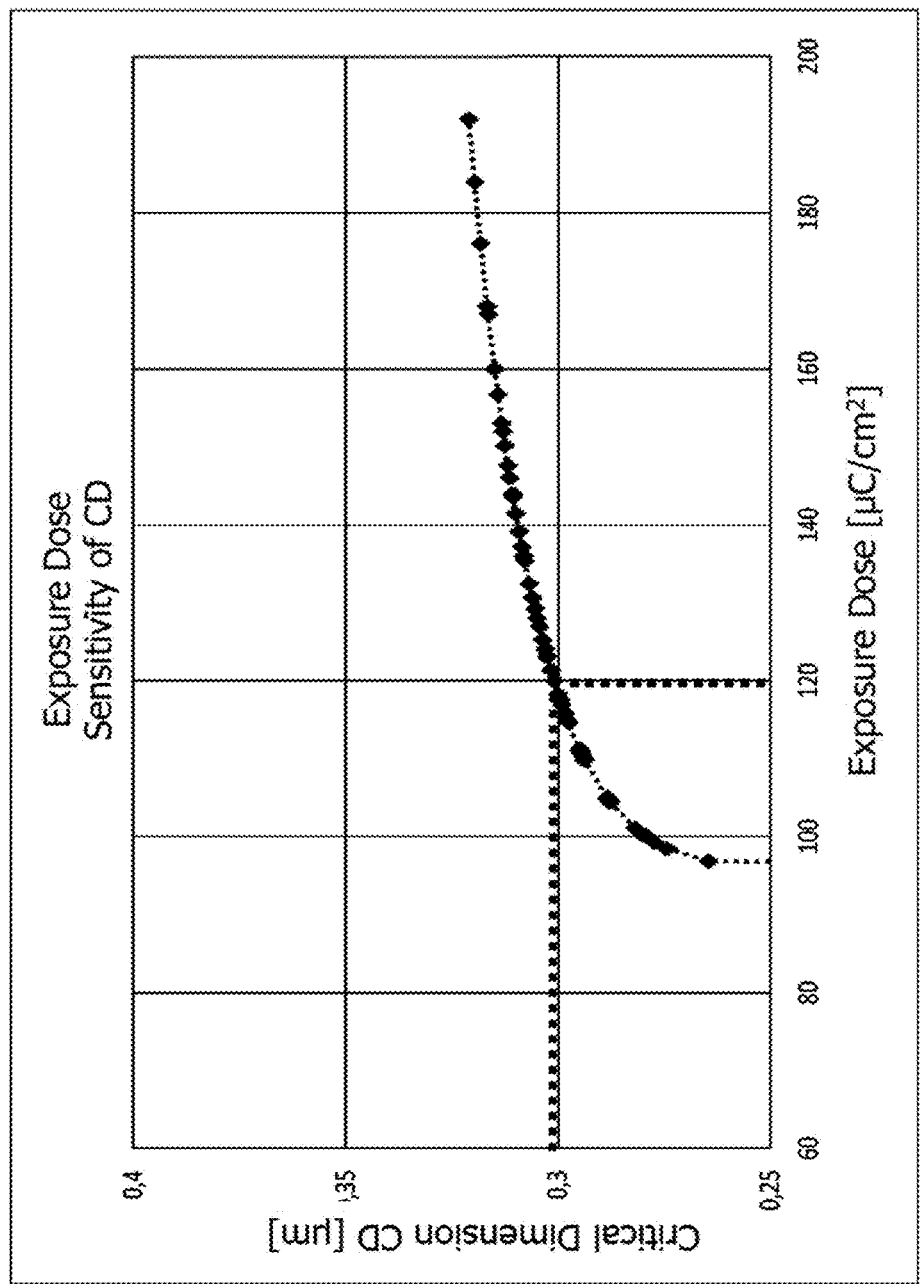
FIG. 1 is a diagram schematically illustrating the CD dependence on the exposure dose.
Figure 2:
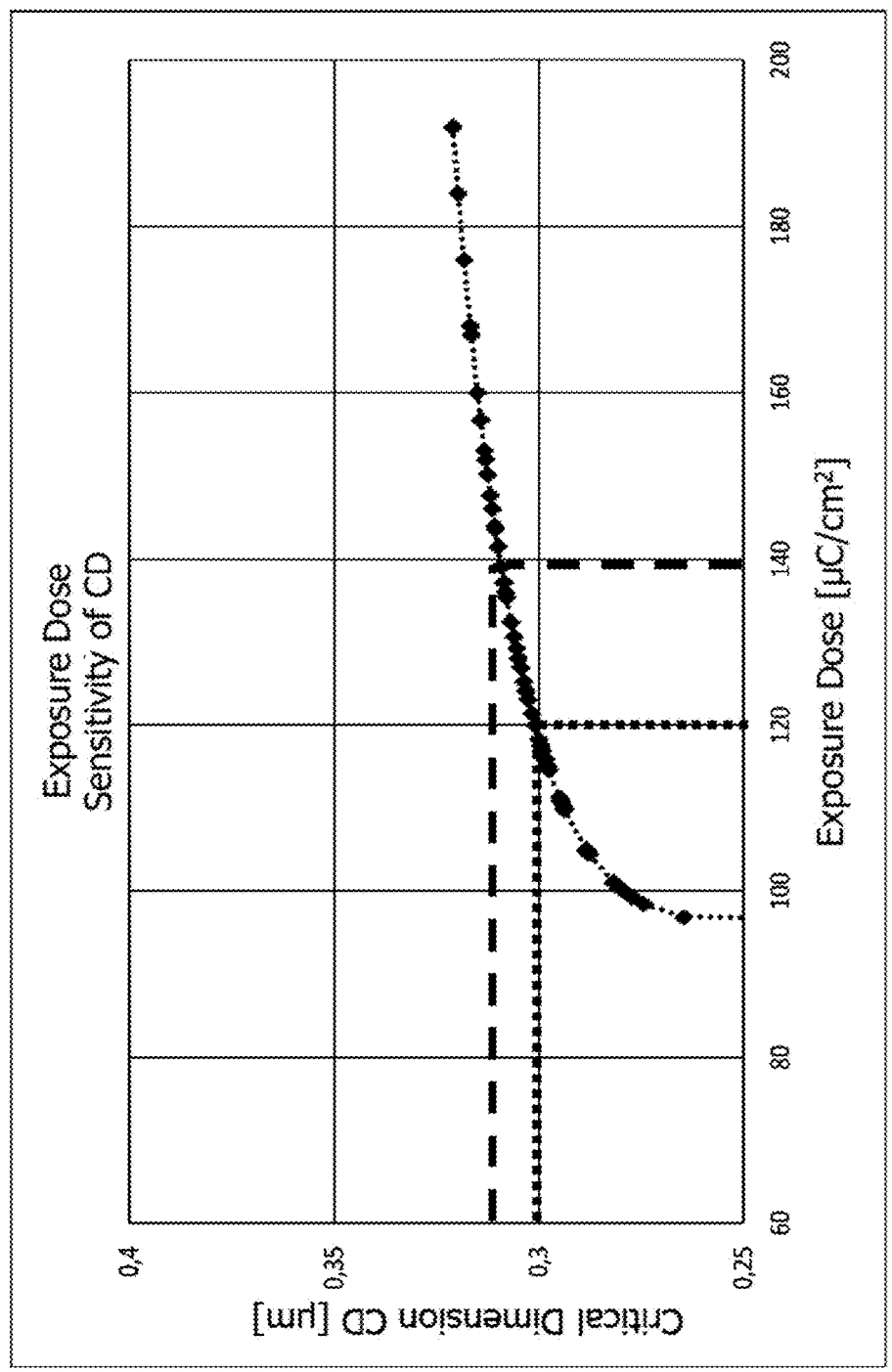
FIG. 2 is a further diagram schematically illustrating the CD dependence on the exposure dose.

In accordance with the exemplary example of FIGS. 1 and 2, the nominal line width of each line in the target layout 140 is 0.30 µm (the nominal line width is the width exposed by the beam writing apparatus 120.). Of course, in principle any line width in the nanometer regime may be used. Moreover, in other embodiments the line patterns may have different nominal line widths and identical for different line densities. It will be appreciated that the patterns could also comprise features different from lines, such as circles, boxes, and so on.

The controller 110 is configured to control the beam writing apparatus 120 to write the five line patterns of the target layout 140 illustrated in FIG. 6 into the same resist stack 130. Alternatively, the patterns may be written in different resist stacks 130 having identical resist parameters (resist sensitivity, resist thickness, etc.). Each line pattern is written at least twice with different exposure doses. Since the accuracy of the procedure will increase with the number of experimental data, each line pattern may be written 10, 20 or more times with different exposure doses. As understood herein, the exposure dose is the dose set at the beam writing apparatus 120 (i.e., the base dose that may optionally be proximity corrected using a suitable dose factor).

After each of the line patterns has been written multiple times with different exposure doses, the exposed resist patterns are developed using identical development parameters (in terms of, e.g., development chemistry, time and temperature). In a next step, the developed resist patterns are subjected to a measurement procedure to determine the respective features CDs (i.e., the width dimension of the lines per line pattern). An optional etching step ("pattern transfer step") may be performed to etch a masking layer underneath the developed resist patterns. The resist may then be removed and the respective CDs of the etched features in the masking layer may be measured. Such a CD measurement of the etched features may be performed in addition to (e.g., for verification or averaging purposes) or instead of a CD measurement of the developed resist pattern.

FIG. 7 schematically shows an exemplary data set 440 that has been generated from the experimental data described above in step 464 of FIG. 4B. The data set 440 has a table-like structure. The lines of the table can be interpreted to constitute individual data records, with each data record pertaining to one measured feature. Each data record associates the measured CD of a particular feature with the respective base dose set at the beam writing apparatus 120 for writing that feature and with the feature density of the pattern comprising the measured feature.

As will be appreciated, the actual exposure doses can be determined from the bases doses by multiplying same with associated dose factors. The associated dose factors, in turn, can be determined from the associated feature densities and supplemental information in terms of one or more of beam form, fogging and electron scattering as underlying the experiments. Such supplemental information may be expressed in the form of a PSF and can already be included in the data set 440. It may alternatively separately be received and combined with the data set 440 to build the enriched data set 460 in the memory 420. Moreover, the data set 440 may also indicate the nominal, or target, $CD_{Target}$.

Figure 8:
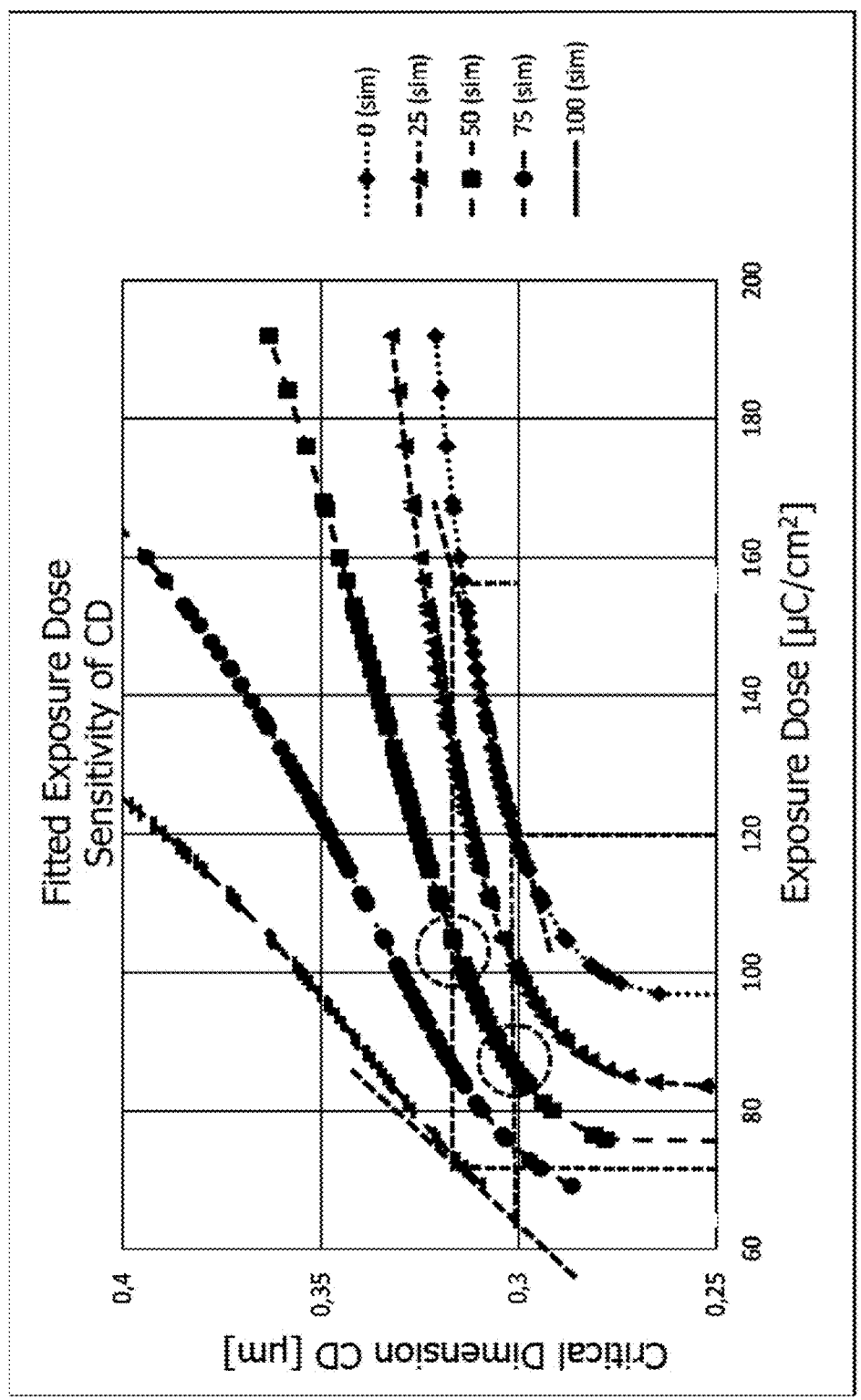
FIG. 8 is a schematic diagram visualizing a fitting of a process model with the data set of FIG. 7.

The individual data records constituting the data set illustrated in FIG. 7 are illustrated as individual points in the diagram of FIG. 8.

It will be appreciated that FIG. 7 only schematically illustrates four such data records, and that the whole data set 440 will typically comprise dozens or hundreds of such data records. Generally, the data records in the data set 440 associate a plurality of measured feature dimensions with a plurality of different feature exposure doses and a plurality of different feature densities. In one example, the same set of (two or more) different exposure doses may be used for exposing features having (two or more) different feature densities. As a result, a plurality of (at least four) measured feature dimensions will be obtained, wherein at least one feature per given feature density is measured.

In the present embodiment it is assumed that the measured features all have the same nominal dimension of, for example, 0.30 µm. In other embodiments, the measured features may have different nominal feature dimensions instead of or in addition to different feature densities. As said, such information may be included as $CD_{Target}$ in the data set 440. It will be appreciated that the quality of the process dose determination technique presented herein will generally increase with the size of the data set 440 (in terms of the number of data records included therein).

The data set 440 is received, via the interface 430, by the apparatus 400. The dataset 440 may be stored in the memory 420 (optionally in form of the enriched data set 460) for being accessed by the processor 410 in step 466. Moreover, as explained above, a parameterized model 450 is provided in the memory 420 in step 468 for being accessed by the processor 410. It will be appreciated that steps 466 and 468 can be performed in any order. It will further be appreciated that the model 450, prior to being stored in a memory 420, could also have been received via the interface 430.

In a further step 470, the processor 410 fits the model 450 with the data set 440 to determine the process dose and the process bias and, as an optional by-product, the process blur of the beam lithography process underlying the test pattern generation step 462. The fitting process is illustrated in FIG.

8 by continuous curves connecting the individual points that correspond to the data records in the data set 440. The fitting step 470 can be performed by any fitting method, such as the conjugate gradient method or the differential evolution method. The fitting step 470 can also comprise a direct solution of the least square problem using a linearized version of the model 450.

The fitting process permits to decouple the process dose from the process bias on the basis of the experimental data reflected in the data set 440. In the isofocal dose example discussed here, the process dose resulting from the fitting step 470 will be the isofocal dose that can later be set at the beam writing apparatus 120 in connection with, for example, optical lithography mask fabrication (see step 472 in FIG. 4B). The corresponding mask fabrication system will have a similar structure as illustrated in FIG. 5 for the test pattern fabrication system 100, wherein the mask layout will correspond to the target layout 140.

Likewise, the process bias resulting from the fitting step 470 may be applied to the mask layout and used as a basis for calculating a shrinking or expansion factor (as generally explained above with reference to FIG. 2) for the target mask pattern input to the beam writing apparatus 120 of the mask fabrication system. Additionally, the process blur from the fitting step 470 may be used for proximity effect correction, for example in connection with properly setting a dose factor for the beam writing apparatus 120. The corresponding dose factor may already be included in the data set defining the mask layout. Alternatively, the corresponding dose factor may be calculated by the beam writing apparatus 120 "on the fly" from the mask layout (e.g., the based on the local mask feature densities) when writing the target mask pattern.

In the following, a more detailed explanation of an exemplary modelling process to derive the model 450 for an isofocal process point will be described.

The measured CD is the result of exposing a feature having the target CD, followed by resist processing (development), pattern transfer, and metrology (i.e., taking into account measurement effects).

$$CD_{measured} = \text{Metrology} \otimes \text{Transfer} \otimes \text{Process} \otimes \text{Exposure}(CD_{Target})$$

The first step is to model the resist exposure process:
1) The absorbed energy E in the resist is the result of convolving the exposure dose $D_{exp}$ with a Point Spread Function (PSF) that models one or more of beam form influences, fogging, electron scattering processes as well as beam blur and focus effects:

$$E(x,y) = D_{exp}(x,y) \otimes PSF$$

2) Without loss of generality, the PSF can be separated in two parts: i) a pattern defining component (forward contribution) and ii) all the energy that is a result of longer range scattering processes (back-scattering, fogging). Both components can be assumed to be a normalized Gaussian distribution:

$$g_\sigma(r) := \frac{1}{\pi\sigma^2} e^{-(\frac{r}{\sigma})^2}$$

Therefore, the PSF becomes:

$$PSF(r) = g_\alpha(r) * \frac{1}{1+\eta} + g_\beta(r) * \frac{\eta}{1+\eta}$$

with η being the relative strength of the back-scattered component in relation to the forward-scattered component. This leads to:

$$E(x,y) = D_{exp}(x,y) \otimes \left(g_\alpha * \frac{1}{1+\eta} + g_\beta * \frac{\eta}{1+\eta}\right)$$

It is to be noted that the following derivation does not depend on the functional form of the PSF. In particular, the assumed Gaussian nature of the scattering distributions is not essential and allows a straight-forward generalization to more general PSFs (e.g., in terms of different distributions or the inclusion of mid-range terms).

3) The exposure dose $D_{exp}$ at the position (x,y) can be re-written as a spatial function P(x,y) (i.e., the actual pattern, a function that is zero in non-patterned areas, and 1 in patterned areas) multiplied with the exposure dose $D_{exp}$ as follows:

$$E(x,y) = D_{exp}(x,y) * \left(P(x,y) \otimes g_\alpha * \frac{1}{1+\eta} + P(x,y) \otimes g_\beta * \frac{\eta}{1+\eta}\right)$$

4) Now the convolution of the pattern P(x,y) with the pattern defining component $g_\alpha(r)$ of the point spread function will be computed; the result will be a function $f_\alpha(x)$. This general formulation allows to work with any type of PSF—it can be Gaussian, or non-Gaussian, and include the beam diameter and resist effects in addition to just the scattering distribution.

Similarly, the convolution of the pattern P(x,y) with the back-scattered energy will be computed. Since the influence range of the involved processes (back-scattering, fogging) is typically large in comparison to the printed feature size, the resulting energy density will be a constant across the feature to print:

$$\theta = D_{exp} * \left(f_\alpha\left(\frac{\Delta CD}{2}\right) * \frac{1}{1+\eta} + \text{density} * \frac{\eta}{1+\eta}\right)$$

5) Since the resist development process acts as a threshold to first order (above a certain dose threshold, resist is completely removed, and below that dose resist is remaining), an energy threshold can be introduced. The variation in CD will be two times the variation in the position x (since a feature has two edges):

$$\Delta CD = 2 * f_\alpha^{-1}\left(\left(\frac{\theta}{D_{exp}} - \text{density} * \frac{\eta}{1+\eta}\right) * (1+\eta)\right)$$

6) From this, the variation in CD can be expressed as a function of exposure dose, the energy threshold, and the pattern density as follows:

$$\Delta CD = 2 * f_\alpha^{-1}\left(\left(\frac{\theta}{D_{exp}} - \text{density} * \frac{\eta}{1+\eta}\right) * (1+\eta)\right)$$

7) Equation 6) is a generic formula that expresses the CD as a function of exposure dose and feature density. As stated before, it does not depend on the concrete nature of the PSF, since various forms (including different distributions) can be used. As a simplification, we will approximate the energy distribution at the edge to be linear:

$$f_a(x) = 0.5 + \frac{\partial E}{\partial x} * x = 0.5 - \frac{\partial E}{\partial x} * \frac{\Delta CD}{2}$$

Since the convolution of a Gaussian distribution $g_a(r)$ with the pattern leads to an Erf(r) function, it can be shown easily that the derivation dE/dx at the edge is directly correlated to the width, a of the Gaussian distribution:

$$\frac{\partial E}{\partial x} = 0.76 * E / \alpha$$

In the following, the term "blur" will be used instead of a to indicate that the experiment can only determine the sum of all the process effects that will result in the measured feature, including scattering, beam size (or beam blur), and resist blur.

8) Inserting this simplified form of fa(x) into 6), we obtain:

$$\Delta CD = \frac{Blur}{0.76} * \left(1 - 2*(1+\eta) * \left(\frac{\theta}{D_{exp}} - \text{density} * \frac{\eta}{1+\eta}\right)\right)$$

9) Now, the isofocal process point can be introduced into the model. As will be explained below, the isofocal condition is expressed by assumptions and parameters settings in the model. Of course, other desired, or "optimum", process points could similarly be included into the model.

Figure 3:
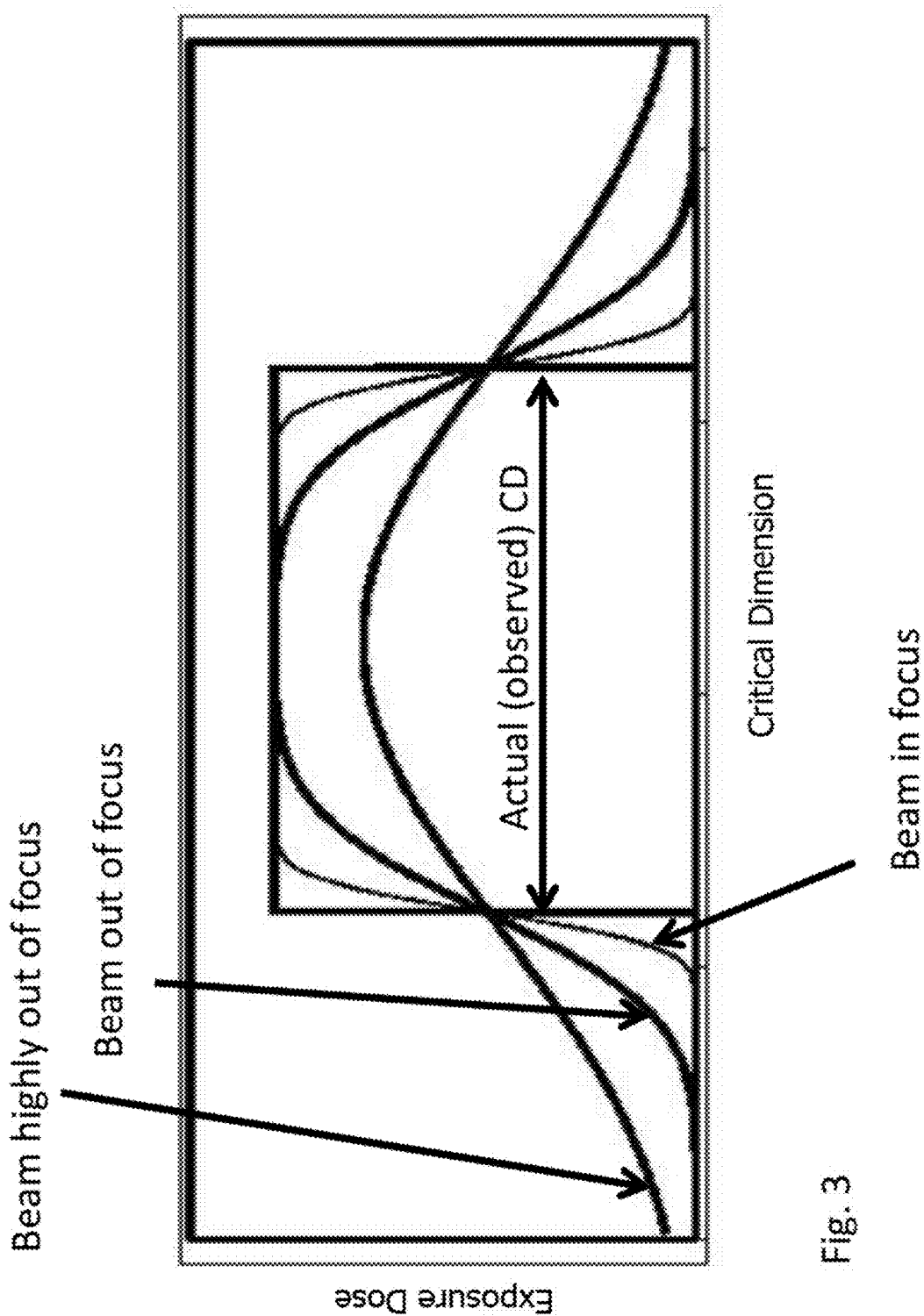
FIG. 3 is a diagram illustrating the process point of the isofocal dose.

In more detail, it follows from the convolution of the pattern with any symmetric distribution that the energy at the feature edge is at ½ of the maximum energy in the center of the feature (see also FIG. 3). Therefore, the energy threshold can be set to ½. Because the experimental data include absolute exposure doses (and relative units such as ½), we introduce the terms process dose (ProcessDose), base dose ($D_{BaseDose}$) and dose factor ($D_f$), with the base dose $D_{BaseDose}$ and the dose factor $D_f$ being set, or dialed in, at the beam writing apparatus 120 in the test pattern fabrication process, and ProcessDose being—in the present embodiment—the isofocal dose required by the beam lithography process. As such, $D_{exp} = D_f * D_{BaseDose}$.

10) At the isofocal point, the ratio process dose/base dose is exactly ½:

$$\Delta CD = \frac{Blur}{0.76} * \left(1 - 2*(1+\eta) * \left(\frac{ProcessDose}{2*D_f*D_{BaseDose}} - \text{density} * \frac{\eta}{1+\eta}\right)\right)$$

With this, the CD can be expressed as a sum of the measured CD, a constant offset (i.e., the process bias that may come from metrology offsets, or pattern transfer offsets), and the dose- and density dependent offsets from above:

$$CD = CD_{Target} + Bias_{const} +$$
$$\frac{Blur}{0.76} * \left(1 - 2*(1+\eta) * \left(\frac{ProcessDose}{2*D_f*D_{BaseDose}} - \text{density} * \frac{\eta}{1+\eta}\right)\right)$$

For the fitting step 470, the parameters CD, $D_f$, $D_{BaseDose}$, and density are populated from data included in or derived from the data set 440 (with $D_f$ being determined, inter alia, from the feature density from the data set 440 as explained above). The parameters PSF (that determines η) and $CD_{Target}$ may likewise be included in the data set 440 or may have been input by a user or determined otherwise. As such, CD, $D_f$, $D_{BaseDose}$, $CD_{Target}$ and PSF (or q) may form the enriched data set 460 in the memory 420.

The fitting step 470 will yield values for ProcessDose and that can be used for setting and the base dose and for adapting the size of the target mask pattern, respectively, as explained above. Additionally, the fitting step 470 will yield a value for Blur that can be used for proximity effect correction (e.g., in terms of determining suitable dose factors $D_f$) as also discussed above.

11) Now that the fundamental modeling mechanism has been shown, the modeling process can be generalized in various forms. For example, the other process steps of pattern transfer (optional) and metrology are assumed to just add a constant offset to the CD. One further extension would be the use of a better functional form at the edge instead of the linearization. Another extension would be to include lateral development effects of the resist process as will now be explained in greater detail.

For most resists, the development rate depends on the deposited energy in the resist as follows:

$$\text{rate} = r_0 * (E/E_0)^\gamma$$

Since the deposited energy in the resist depends on the amount of scattering from adjacent features, the lateral process bias can be modelled as:

$$Bias_{lateral} = c_R * \left(D_{exp} * \text{density} * \frac{\eta}{1+\eta}\right)^\gamma$$

γ is the so called resist contrast and enters the model as a constant. $c_R$ is a further process bias parameter to be fitted in the fitting step 470. Specifically, $c_R$ is indicative of exposure dose and density dependencies.

Therefore, the total process bias is the sum of a constant process bias sub-term and a feature density-dependent process bias sub-term. It may be included as additive terms in the model 450 of equation 10):

$$Bias = Bias_{const} + c_R * \left(D_{exp} * \text{density} * \frac{\eta}{1+\eta}\right)^\gamma$$

The fitting step 470 will then also yield a value for $c_R$ that can be used for further adapting the size of the target mask pattern as explained above.

The present invention has been described with reference to exemplary embodiments. It will be appreciated that the invention can be practice in other embodiments that depart

The invention claimed is:

1. A method for beam lithography, comprising:
   accessing a data set that associates a plurality of measured dimensions of features exposed by beam lithography with (i) a plurality of different exposure doses, wherein the features were exposed with the different exposure doses, and with (ii) at least one of a plurality of different feature densities of the exposed features and a plurality of different nominal dimensions of the exposed features;
   providing a model that is parameterized in at least the following parameters:
      (i) a measured feature dimension;
      (ii) an exposure dose;
      (iii) at least one of feature density and nominal feature dimension;
      (iv) a process dose; and
      (v) at least one process bias;
   fitting the model using the data set as input for the parameters of the model and separately determining the process dose and the process bias; and
   exposing a lithography pattern using at least one of the process dose and the process bias determined by the fitting.

2. The method of claim 1, wherein
the model comprises a process dose term including the process dose parameter, and wherein the process dose term is modelled under the assumption that a ratio between the process dose and one of a threshold dose to clear an exposed resist and an onset dose to have an exposed resist remain is a constant.

3. The method of claim 2, wherein
the constant equals one of
0.5 to set the process dose to the isofocal dose and
1.0 to set the process dose for three-dimensional lithography.

4. The method of claim 2, wherein
the process dose term is modelled to include the ratio $$\text{ProcessDose}/(\text{constant}*D_{exp}),$$

wherein ProcessDose is the process dose parameter and $D_{exp}$ is the exposure dose parameter.

5. The method of claim 1, wherein
the model comprises a process dose term including the process dose parameter and a feature density parameter, wherein in the process dose parameter is modelled to be a feature density-independent parameter and wherein the feature density parameter is configured to model a feature density-dependency of the process dose term.

6. The method of claim 1, wherein
the model comprises a process bias term including a first process bias parameter, and wherein the first process bias term is feature density-independent.

7. The method of claim 6 or, wherein
the process bias term includes a second process bias parameter that is feature density-dependent.

8. The method of claim 1, wherein
the model comprises a process bias term including the at least one process bias parameter, and wherein the process bias term is modelled as an additive term in the model.

9. The method of claim 1, wherein
the model comprises a measured feature dimension term including the measured feature dimension parameter, and wherein the measured feature dimension term is modelled as an additive term in the model.

10. The method of claim 1, wherein
the model is further parametrized in a blur parameter.

11. The method of claim 1, wherein
the features were exposed to have at least one common nominal dimension.

12. The method of claim 1, wherein
a pattern of the features to be exposed is subjected to a proximity effect correction prior to exposure.

13. The method of claim 1,
wherein the lithography pattern is processed utilizing a first set of process parameters and wherein the first set of process parameters is similar to a second set of process parameters, based on which the data set has been obtained.

14. A non-transitory computer readable medium storing program code that causes one or more computing devices to perform:
   accessing a data set that associates a plurality of measured dimensions of features exposed by beam lithography with (i) a plurality of different exposure doses, wherein the features were exposed with the different exposure doses, and with (ii) at least one of a plurality of different feature densities of the exposed features and a plurality of different nominal dimensions of the exposed features;
   providing a model that is parameterized in at least the following parameters:
      (i) a measured feature dimension;
      (ii) an exposure dose;
      (iii) at least one of feature density and nominal feature dimension;
      (iv) a process dose; and
      (v) at least one process bias;
   fitting the model using the data set as input for the parameters of the model and separately determining the process dose and the process bias; and
   using at least one of the process dose and the process bias determined by the fitting to control an exposure of a lithography pattern.

15. An apparatus for beam lithography process, the apparatus comprising:
   a memory storing
      (a) a data set that associates a plurality of measured dimensions of features exposed by beam lithography with (i) a plurality of different exposure doses, wherein the features were exposed with the different exposure doses, and with (ii) at least one of a plurality of different feature densities of the exposed features and a plurality of different nominal dimensions of the exposed features, and
      (b) a model that is parameterized in at least the following parameters:
         (i) a measured feature dimension;
         (ii) an exposure dose;
         (iii) at least one of feature density and nominal feature dimension;
         (iv) a process dose; and
         (v) at least one process bias;
   a processor fitting the model using the data set as input for the parameters of the model and separately determining the process dose and the process bias; and
   a beam writing apparatus exposing a lithography pattern using at least one of the process dose and the process bias determined by the processor.

* * * * *